United States Patent
Cabuz et al.

(10) Patent No.: US 6,808,956 B2
(45) Date of Patent: Oct. 26, 2004

(54) THIN MICROMACHINED STRUCTURES

(75) Inventors: Cleopatra Cabuz, Edina, MN (US); Jeffrey Alan Ridley, Shorewood, MN (US)

(73) Assignee: Honeywell International Inc., Morristown, NJ (US)

(*) Notice: Subject to any disclaimer, the term of this patent is extended or adjusted under 35 U.S.C. 154(b) by 109 days.

(21) Appl. No.: 09/749,171

(22) Filed: Dec. 27, 2000

(65) Prior Publication Data

US 2002/0081765 A1 Jun. 27, 2002

(51) Int. Cl.⁷ .................. H01L 21/00; H01L 21/30; H01L 21/46
(52) U.S. Cl. .................. 438/52; 438/53; 438/436
(58) Field of Search .................. 438/50, 51, 52, 438/53; 73/514.21, 514.22, 514.23, 514.36, 504.14, 504.15, 504.16, 862.632, 862.633, 862.634, 862.637, 862.638, 862.679

(56) References Cited

U.S. PATENT DOCUMENTS

| | | | |
|---|---|---|---|
| 4,654,663 A | 3/1987 | Alsenz et al. | 340/870.3 |
| 4,855,544 A | 8/1989 | Glenn | |
| 5,013,681 A | 5/1991 | Godbey et al. | |
| 5,313,835 A | 5/1994 | Dunn | 73/505 |
| 5,329,815 A | 7/1994 | Dunn et al. | 73/505 |
| 5,343,064 A | 8/1994 | Spangler et al. | |
| 5,413,955 A * | 5/1995 | Lee et al. | 437/86 |
| 5,490,420 A | 2/1996 | Burdess | 73/504.02 |
| 5,492,596 A | 2/1996 | Cho | 156/632.1 |

(List continued on next page.)

FOREIGN PATENT DOCUMENTS

| | | |
|---|---|---|
| DE | 199 29 776 A1 | 9/2002 |
| JP | 41024283 A * | 9/1998 |
| WO | WO 0078667 A | 12/2000 |

OTHER PUBLICATIONS

Xiao et al. "Silicon micro-accelerometer with mg resolutoin . . . ", Sensors and Acuators 77 (1999) pp. 113–119.*

(List continued on next page.)

Primary Examiner—John F. Niebling
Assistant Examiner—Viktor Simkovic
(74) Attorney, Agent, or Firm—Kris T. Fredrick

(57) ABSTRACT

Methods for making thin silicon layers suspended over recesses in glass wafers or substrates are disclosed. The suspended silicon wafers can be thin and flat, and can be made using methods not requiring heavy doping or wet chemical etching of the silicon. Devices suitable for production using methods according to the invention include tuning forks, combs, beams, inertial devices, and gyroscopes. One embodiment of the present invention includes providing a thin silicon wafer, and a glass wafer or substrate. Recesses are formed in one surface of the glass wafer, and electrodes are formed in the recesses. The silicon wafer is then bonded to the glass wafer over the recesses. The silicon wafer is them etched to impart the desired suspended or silicon wafer structure. In another embodiment of the present invention, the silicon wafer has a patterned metal layer. The silicon wafer is bonded to the glass wafer, with the patterned metal layer positioned adjacent the recesses in the glass wafer. The silicon wafer is selectively etched down to the metal layer, which serves as an etch stop. The metalized layer can provide sharper feature definition at the silicon-metalization layer interface, and may also serve to seal gasses within the recessed cavities of the glass wafer during the silicon etching process. The metal layer can then be subsequently removed.

42 Claims, 4 Drawing Sheets

U.S. PATENT DOCUMENTS

| | | | |
|---|---|---|---|
| 5,542,558 A | | 8/1996 | Benz et al. |
| 5,576,251 A | * | 11/1996 | Garabedian et al. ......... 437/228 |
| 5,646,348 A | | 7/1997 | Greiff et al. ............. 73/514.36 |
| 5,757,103 A | | 5/1998 | Lee et al. .................... 310/309 |
| 5,817,942 A | | 10/1998 | Greiff ...................... 73/514.01 |
| 5,866,469 A | | 2/1999 | Hays |
| 5,869,760 A | | 2/1999 | Geen ....................... 73/504.12 |
| 5,880,368 A | | 3/1999 | FritzPatrick ................. 73/493 |
| 5,894,090 A | | 4/1999 | Tang et al. .............. 73/504.02 |
| 5,914,801 A | | 6/1999 | Dhuler et al. ............... 359/230 |
| 5,969,250 A | | 10/1999 | Greiff ...................... 73/514.38 |
| 5,992,233 A | | 11/1999 | Clark ....................... 73/514.35 |
| 5,994,204 A | | 11/1999 | Young et al. |
| 6,008,138 A | | 12/1999 | Laermer et al. |
| 6,067,858 A | | 5/2000 | Clark et al. .............. 73/504.16 |
| 6,087,747 A | | 7/2000 | Dhuler et al. ................. 310/90 |
| 6,089,088 A | | 7/2000 | Charvet .................... 73/504.12 |
| 6,089,089 A | | 7/2000 | Hsu ........................ 73/504.12 |
| 6,092,417 A | | 7/2000 | Yamamoto ............... 73/504.04 |
| 6,125,700 A | | 10/2000 | Tsugai et al. ............. 73/504.12 |
| 6,150,681 A | * | 11/2000 | Allen .......................... 257/254 |
| 6,190,571 B1 | | 2/2001 | Kato ............................. 216/2 |
| 6,232,861 B1 | * | 5/2001 | Asada ......................... 335/222 |
| 6,242,276 B1 | * | 6/2001 | Baek et al. .................... 438/51 |
| 6,271,955 B1 | * | 8/2001 | Atobe et al. ................ 359/291 |
| 6,277,666 B1 | | 8/2001 | Hays et al. |
| 6,372,609 B1 | | 4/2002 | Aga et al. |
| 2001/0029072 A1 | | 10/2001 | Kuwahara et al. |

OTHER PUBLICATIONS

J. Bernstein et al., "A Micromachined Comb–Drive Tuning Fork Rate Gyroscope," *Digest of IEEE/ASME MEMS Workshop*, pp. 143–148 (Feb. 1993).

W. A. Clark et al., "Surface Micromachined X–Axis Vibratory Rate Gyroscope," *Proceedings of Solid State Sensor and Actuator Workshop*, pp. 283–287 (Jun. 2–6, 1996).

Dave Van Domelen, "The Coriolis Effect," http://www.physics.ohio–state.edu/~dvandom/Edu/coriolis.html, pp. 1–3 (1996).

"Coriolis Effect," http://zebu.uoregon.edu/~js/glossary/coriolis_effect.html (dated on or before Dec. 27, 2000.

Thesis by William Clark, University of Berkley, "Micro Machined Vibratory Rate Gyroscopes", 1997, pp. 14–21.

Y.B. Gianchandani et al., "A Bulk Silicon Dissolved Wafer Process for Microelectromechanical Devices", Journal of Microelectromechanical Systems, vol. 1, No. 2, Jun. 1992, pp. 77–85.

Mochida, Y., et al., "A Micromachined vibrating rate gyroscope with independent beams for the drive and detection modes", Sensors and Actuators A, 80 (2000) pp. 170–178.

Puers, R., et al., "Design and processing experiments of a new miniaturized capacitive triaxial accelerometer", Sensors and Actuators A 68 (1998) pp. 324–328.

Xiao, Zhixiong, et al., "Silicon micro–accelerometer with mg resolution, high linearity and large frequency bandwidth fabricated with two mask bulk process", Sensores and Actuators 77 (1999), pp. 113–119.

* cited by examiner

THIN MICROMACHINED STRUCTURES

CROSS-REFERENCE TO CO-PENDING PATENT APPLICATIONS

This application is related to co-pending U.S. patent application Ser. No. 09/748,488, entitled "SOI/GLASS PROCESS FOR FORMING THIN SILICON MICROMACHINED STRUCTURES", filed on date even herewith and incorporated herein by reference.

FIELD OF THE INVENTION

The present invention is related generally to semiconductor manufacturing and Micro Electro Mechanical Systems (MEMS). More specifically, the invention relates to methods for providing thin silicon micromachined structures.

BACKGROUND OF THE INVENTION

Micro Electro Mechanical Systems (MEMS) often utilize micromachined structures such as beams, slabs, combs, and fingers. These structures can exhibit curvature due to internal stresses and doping gradients. The curvature can be a significant source of error in inertial sensors such as accelerometers, tuning forks, and gyroscopes. Many desired structures have a flatness design criteria that are difficult or impossible to achieve using current processes. In particular, silicon layers heavily doped with boron can have a significant curvature when used in suspended structures.

The aforementioned structures are often made starting with a silicon wafer substrate. A boron-doped silicon epitaxial layer is then grown on the silicon wafer substrate and is subsequently patterned in the desired shape. As is further described below, the boron is used as an etch stop in later processing to allow for easy removal of the silicon substrate, leaving only the thin boron-doped epitaxial layer.

At the interface between the boron-doped epitaxial layer and the silicon substrate, the boron tends to diffuse out of the epitaxial layer and into the silicon substrate. This depletes the epitaxial layer of some boron, and enriches the silicon substrate with boron. The epitaxial layer thus often has a reduced concentration of boron near the interface, which is sometimes called the "boron tail."

After the boron-doped silicon epitaxial layer has been grown to the desired thickness, the silicon substrate is often removed using an etchant that is boron selective. Specifically, the etchant will etch away the silicon substrate, but not the boron-doped silicon epitaxial layer. One such etchant is a solution of ethylene diamine, pyrocatechol, and water (EDP). The etchant typically etches the silicon at a fast rate up to a certain high level boron concentration, at which point the etch rate significantly slows. This high boron concentration level is termed the etch stop level.

The boron concentration near the epitaxial layer surface having the boron tail may be lower than the etch stop level, allowing the etching to remove some of the epitaxial layer surface at a reasonable rate, stopping at the etch stop level of boron concentration beneath the initial surface. The resulting boron-doped structure, such as a beam, thus has two surfaces, the silicon side surface that has the boron tail and the airside surface that has a boron surface layer concentration substantially equal to the concentration in the bulk of the beam away from either surface. Thus, the opposing surfaces have different boron surface layer concentrations.

The building of a suspended element often includes using an epitaxially grown single-crystal silicon heavily doped with boron, for example, greater than ten to the twentieth atoms per cubic centimeter ($10^{20}/cm^3$). In some applications, this doped material may present problems. One problem is an intrinsic tensile stress, which, when the boron-doped layer is relatively thick, can produce severe wafer bow. This wafer bow is incompatible with some fabrication steps. Another problem is that the thickness of the epitaxial layer may be limited due to technological reasons, for example, deposition conditions. Yet another problem is that the Young modulus of the boron-doped material may be lower than that of silicon, and may not be well known and understood.

In addition, the intrinsic losses of the boron-doped material may be higher than those of low-doped silicon. In the lost wafer process, the final release of the mechanical structure is often performed using a long, wet-etching step, which can be based on ethylene-diamine-pyrocathacol (EDP) solution, which requires careful control to maintain industrial hygiene standards during manufacture. What would be desirable is a fabrication process that eliminates the need for highly doped silicon and does not require a wet-etching step using EDP.

SUMMARY OF THE INVENTION

The present invention includes methods for making a thin silicon micromachined structure that can be used to make Micro Electro Mechanical Systems (MEMS). The thin silicon structure can be used in any number of applications including accelerometers, gyroscopes, and inertial sensing devices.

One illustrative method of the present invention uses a glass wafer or substrate and a thin silicon wafer having substantially planar first and second surfaces. The thin silicon wafer preferably has a thickness between about 10 and 100 microns or more. Recesses are formed in the glass wafer surface using standard photolithography techniques. After formation of the recesses, electrodes may be formed in the recesses and, in some embodiments, on the surface of the glass wafer, if desired. The electrodes within the recesses may serve as, for example, one plate of a capacitor used to sense distance to, or vibration of, a later added suspended structure disposed over the recess.

The silicon wafer can be bonded to the glass wafer or substrate over the recessed and non-recessed portions, using an appropriate method such as the anodic bonding, adhesives, heat bonding or any other suitable means. After bonding, a photolithography step can be performed on the back side of the now-bonded silicon wafer in order to define a shape on the silicon wafer. A DRIE process, or other suitable process, may then be used to etch the silicon, thus forming the silicon into the desired shape. Suitable shapes include tuning forks, combs, and cantilevered structures, among others. The silicon is preferably etched entirely through the silicon wafer.

In another illustrative embodiment of the present invention, a glass wafer or substrate and a thin silicon wafer with a metal layer on one surface thereof are provided. Like above, the glass wafer may be etched to form a recess or recesses in the glass wafer surface, and electrodes may be formed on the glass wafer surface and/or in the recesses. At least a portion of the metal layer on the silicon wafer is preferably patterned to coincide with the recesses in the glass wafer. The silicon wafer may then be bonded to the glass wafer surface, with the metal layer toward the glass wafer. After bonding, a photolithographic or other suitable process may be used to etch the silicon into a desired pattern, preferably in the region above the patterned metal layer. The etchant is preferably selected to etch through the silicon but not the underlying metal layer. The metal layer thus act as an etch stop. The metal layer is believed to allow for sharper feature definition at the silicon-metalization layer interface, and also provides a barrier during the silicon etch step that may prevent gases in the recesses from escaping into the atmosphere, such as into a DRIE chamber. After etching of the silicon, the metal layer is preferably removed using standard etching techniques.

DETAILED DESCRIPTION OF THE INVENTION

Figure 1A:
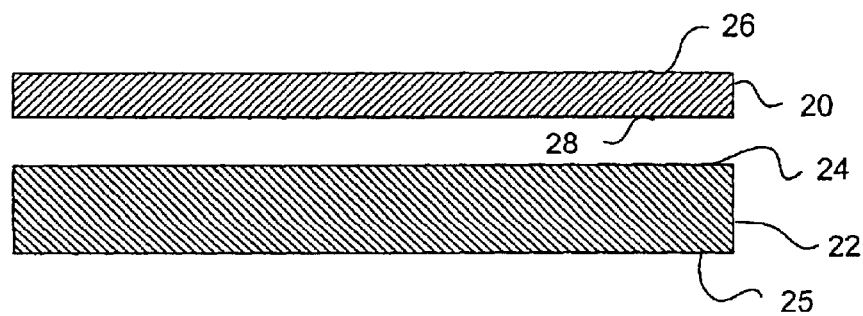
FIG. 1A is a highly diagrammatic, longitudinal cross-sectional view of a silicon wafer and a glass wafer used in one process.

Referring now to FIG. 1A, a silicon wafer 20 having a first surface 28 and a second, substantially co-planar surface 26 is illustrated. Silicon wafer 20 is preferably undoped or substantially undoped (such as less than $10^{18}/cm^3$, and more preferably less than about $10^{17}/cm^3$, and has a thickness of about between 5 and 200 microns or more preferably between about 10 and 100 microns, depending on the application. A glass wafer or substrate 22 is also provided, preferably formed from a material such as a Pyrex™ Corning Type No. 7740. The glass wafer 22 has a first surface 24 and substantially co-planar second surface 25.

Figure 1B:
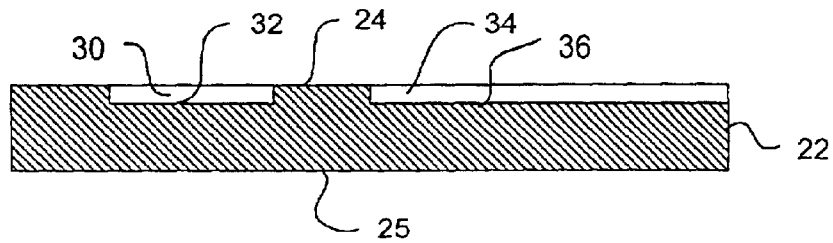
FIG. 1B is a highly diagrammatic, longitudinal cross-sectional view of the glass wafer of FIG. 1A after recesses have been etched in the glass wafer surface.

To form an accelerometer, tuning fork, or gyroscope or the like, recesses are formed in the top surface 24 of the glass wafer. In FIG. 1B, a first recess 30 and a second recess 34 are etched into the top surface 24 of the glass wafer 22. The first recess has a first recessed surface 32 and the second recess 34 has a second recessed surface 36. In some embodiments of the present invention, the recesses are used to form a capacitive gap for the detection of displacement of inertial electrodes, and are formed using standard etching techniques well known to those skilled in the art.

Figure 1C:
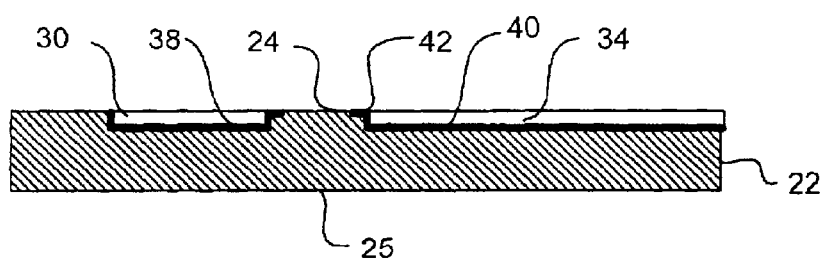
FIG. 1C is a highly diagrammatic, longitudinal cross-sectional view of the glass wafer of FIG. 1B after an electrode has been formed on the glass wafer surface in the recess areas.

FIG. 1C illustrates glass wafer 22 after electrodes 38 and 40 have been formed on the first recessed surface 32 and the second recessed surface 36. Although electrodes 38 and 40 are shown covering substantially all of the recesseD surfaces 32 and 36, it is contemplated that only a portion of the recessed surfaces 32 and 36 may be covered, if desired. In addition, the second recess 34 has an electrode tab or ear 42 extending nearer the unrecessed surface of the glass wafer 22. This may or may not be required, depending on the application. Metal electrodes 38 and 40 are preferably formed using techniques well known to those skilled in the art. In one illustrative embodiment, the electrodes are titanium-platinum or gold-based electrodes.

Figure 1D:
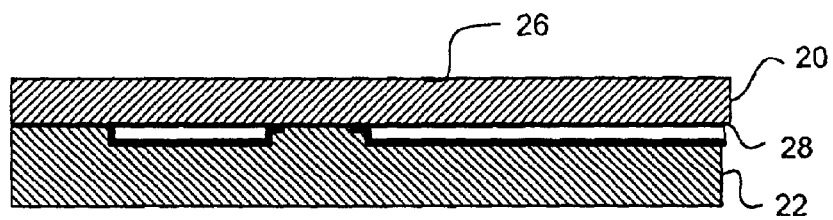
FIG. 1D is a highly diagrammatic, longitudinal cross-sectional view of the glass wafer of FIG. 1C after the silicon wafer of FIG. 1A has been bonded over the etched and non-etched surfaces of the glass wafer of FIG. 1C.

FIG. 1D illustrates silicon wafer 20 and glass wafer 22 after the first surface 28 of silicon wafer 20 has been bonded to glass wafer 22. As may be seen from inspection of FIG. 1D, silicon wafer 20 has been bonded over both recessed and nonrecessed portions of glass wafer 22. In one embodiment, silicon wafer 20 is bonded using an anodic bonding process. However, other bonding techniques may be used including adhesives, heat bonding, etc.

Figure 1E:
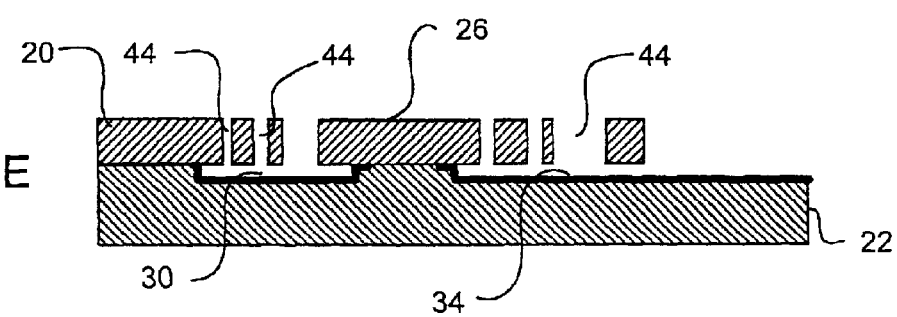
FIG. 1E is a highly diagrammatic, longitudinal cross-sectional view of the silicon wafer and glass wafer of FIG. 1D after the silicon wafer has been etched.

FIG. 1E illustrates silicon wafer 20 after an etch has been performed on the second surface 26 of silicon wafer 20. When forming a typical device, such as an accelerometer, tuning fork, or gyroscope, several etched regions 44 may be formed. Preferably, the silicon etch extends through the silicon wafer 20 and into recesses 30 and 34 of the glass wafer 22. The silicon is preferably etched using standard silicon etching procedures, such as a Deep Reactive Ion Etch (DRIE) process. Preferably, a standard photolithography process is used to define the desired structural shapes into the silicon wafer 20. Examples of suitable shapes include, but are not limited to, cantilevered beams, suspended beams, combs, tuning forks, etc.

Figure 2A:
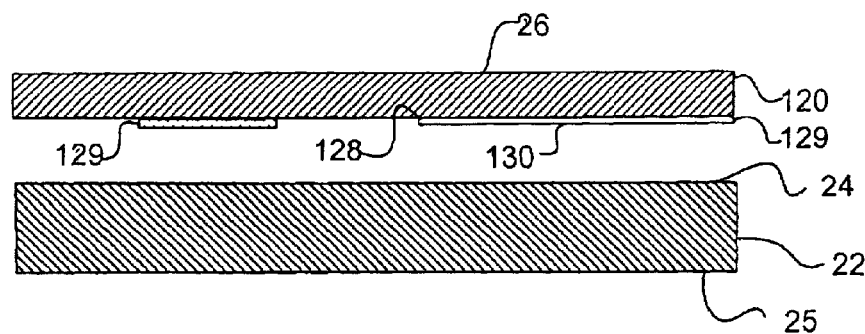
FIG. 2A is a highly diagrammatic, longitudinal cross-sectional view of a silicon wafer having a metalized surface and a glass wafer used in one embodiment process.

In another illustrative embodiment, and referring now to FIG. 2A, a silicon wafer 120 is provided. As above, the silicon wafer has a thickness of about between 5 and 200 microns or more preferably between about 10 and 100 microns, depending on the application. A metal layer 129 is then provided on one surface of the silicon wafer 120. The metal layer 129 may be provided as part of the originally supplied silicon wafer or it may be deposited or otherwise formed thereupon using conventional methods. One suitable metal for the formation of metal layer 129 is chromium on oxide, although other metals or alloys may be used.

Figure 2B:
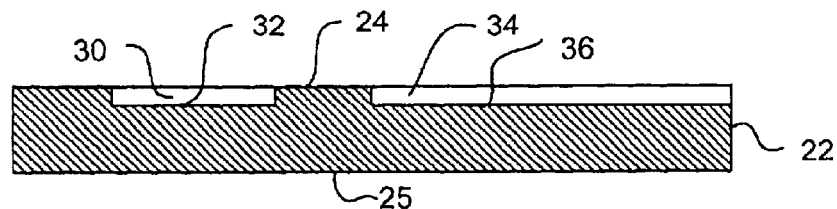
FIG. 2B is a highly diagrammatic, longitudinal cross-sectional view of the glass wafer of FIG. 2A after recesses have been etched into the glass wafer surface.
Figure 2C:
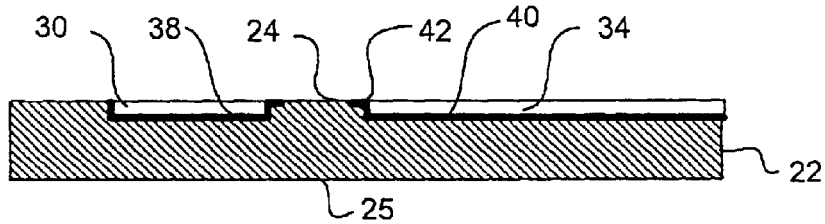
FIG. 2C is a highly diagrammatic, longitudinal cross-sectional view of the glass wafer of FIG. 2B after electrodes have been formed on the recessed surfaces.

FIG. 2B illustrates a glass wafer 22 after recesses 30 and 34 have been formed, as previously discussed above with respect to FIG. 1B. FIG. 2C illustrates glass wafer 22 after formation of electrodes 38 and 40, as previously discussed with respect to FIG. 1C. Preferably, the metal layer 129 is patterned so that the remaining metal corresponds to or is otherwise defined to fit within recesses 30 and 34.

Figure 2D:
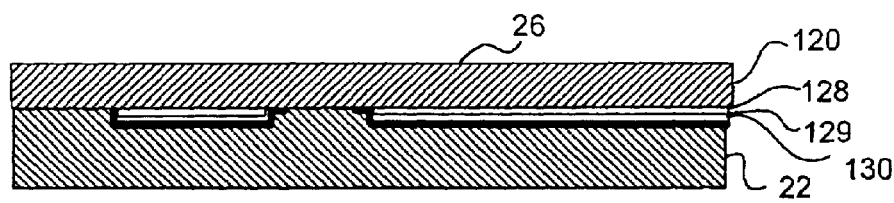
FIG. 2D is a highly diagrammatic, longitudinal cross-sectional view of the metalized silicon wafer of FIG. 2A, and the metalized, recessed glass wafer of FIG. 2C after bonding of the silicon wafer to the glass wafer.

In FIG. 2D, the metalized silicon wafer 120 is shown bonded to the glass wafer 22, with the metal layer 129 situated adjacent the glass wafer 22. One method for bonding the silicon wafer 120 to the glass wafer 22 is anodic bonding. A by-product of some anodic bonding processes is the release of oxygen. As can be seen, the cavities formed between the recesses 30 and 34 and the silicon wafer 120 may collect the oxygen released during the anodic bonding process, and thus may have an increased concentration thereof.

Figure 2E:
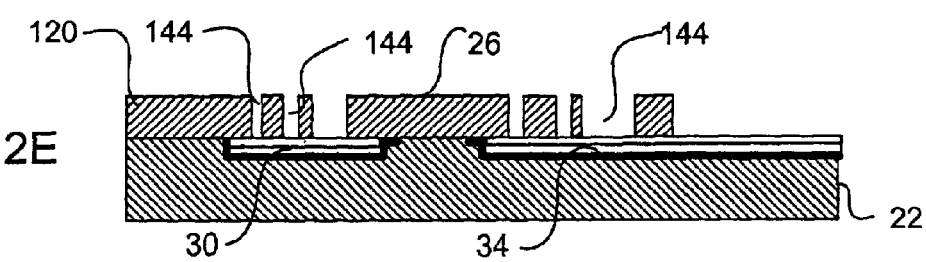
FIG. 2E is a highly diagrammatic, longitudinal cross-sectional view of the silicon wafer and glass wafer of FIG. 2D after the silicon wafer has been etched through up to the silicon wafer metalized surface.

FIG. 2E shows the silicon wafer 120 after a pattern has been etched therein to form the desired structure. The etching preferably includes a suitably selective etching technique that etches through silicon wafer layer 120, but not through metal layer 129. Standard lithography techniques can be used to define the series of recesses, channels, or holes 144 through the silicon wafer 120, but not through the metal layer 129. The metal layer 129 thus may serve as an etch stop layer. It has been found that by providing an etch stop layer, sharper feature definition at the interface of the silicon wafer 120 and the metal layer 129 can be achieved, resulting in more precise feature definition in the resulting silicon structure.

Another benefit of providing metal layer 129 is that a seal or barrier is provided to prevent gasses from escaping from recesses 30 and 34 into the atmosphere during the silicon etching process. This can be particularly important when the silicon wafer 120 is etched using an etching process that relies at least in part on the gas composition in the surrounding atmosphere, such as a DRIE etching process. The release of gases, such as oxygen which as described above may be collected in the recesses 30 and 34 during the anodic bonding process, can effect the effectiveness and/or controllability of some etching processes, such as a DRIE etching process.

Figure 2F:
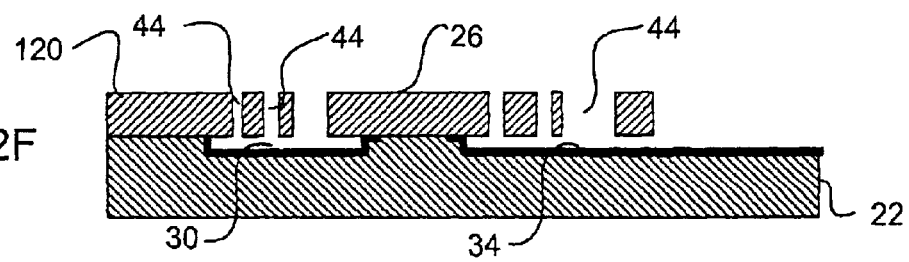
FIG. 2F is a highly diagrammatic, longitudinal cross-sectional view of the silicon wafer and the glass wafer of FIG. 2E after the metalized surface of the silicon wafer has been removed.

FIG. 2F illustrates the silicon wafer 120 and glass wafer 22 after the metal layer 129 has been removed. The metal layer 129 may be removed in recess areas 30 and 34 using techniques well known to those skilled in the art. In one example, an etchant capable of removing the metal layer 129, but not the silicon wafer 120, may be applied to the silicon wafer recesses 144. The etchant may thus dissolve metal layer 129. In a preferred embodiment, the etchant is capable of removing metal layer 129, but does not remove electrodes 38 and 40. FIG. 2F illustrates the resulting product having a silicon layer 120 formed into a suitable structure and bonded to glass wafer 22.

Figure 3A:
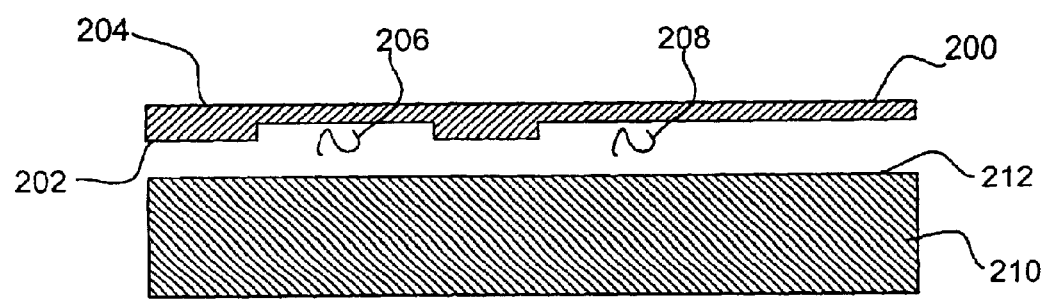
FIGS. 3A–3C are highly diagrammatic, longitudinal, cross-sectional views similar to that shown in FIGS. 1A–1E above, but with the recess or recesses formed in the silicon wafer rather than the glass wafer.
Figure 3B:
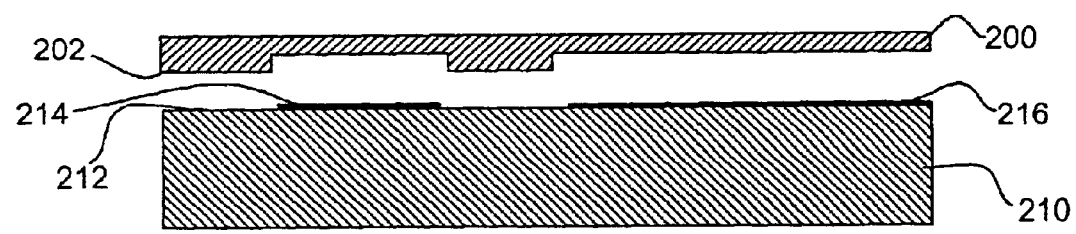
Figure 3C:
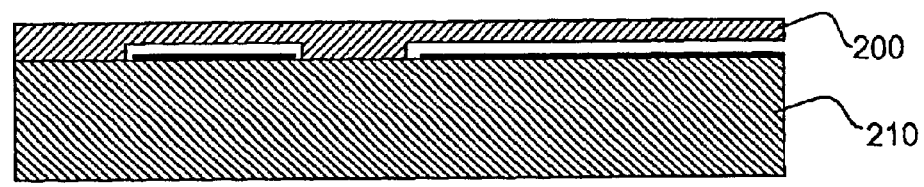

FIGS. 3A–3C are highly diagrammatic, longitudinal, cross-sectional views similar to that shown in FIGS. 1A–1E above, but with the recess or recesses formed in the silicon wafer rather than the glass wafer. FIG. 3A illustrates a silicon wafer 200 having a first surface 202 and a second, substantially co-planar surface 204. A first recess 206 and a second recess 208 are etched into the first surface 202 of the silicon wafer 200, as shown. Preferably, the first recess 206 and the second recess 208 do not extend all the way through the silicon wafer 200. In some embodiments, the recesses are used to form a capacitive gap for the detection of displacement of inertial electrodes, and are formed using standard etching techniques well known to those skilled in the art. A glass wafer or substrate 210 is also provided, preferably formed from a material such as a Pyrex™ Corning Type No. 7740. The glass wafer 210 has a first surface 212.

FIG. 3B illustrates the glass wafer 210 after electrodes 214 and 216 have been formed on the first surface 212 of the glass wafer 210. FIG. 3C illustrates silicon wafer 200 and glass wafer 210 after the first surface 202 of the silicon wafer 200 has been bonded to the first surface 212 of glass wafer 210. In one embodiment, silicon wafer 200 is bonded using an anodic bonding process. However, other bonding techniques may be used including adhesives, heat bonding, etc. The remaining processing steps may be similar to that shown and described above with respect to FIG. 1E.

Figure 4A:
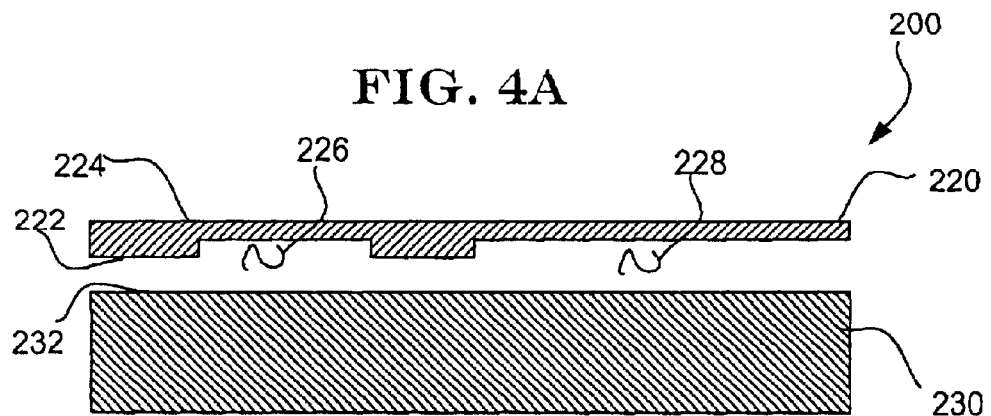
FIGS. 4A–4C are highly diagrammatic, longitudinal, cross-sectional views similar to that shown in FIGS. 2A–2F above, but with the recess or recesses formed in the silicon wafer rather than the glass wafer.
Figure 4B:
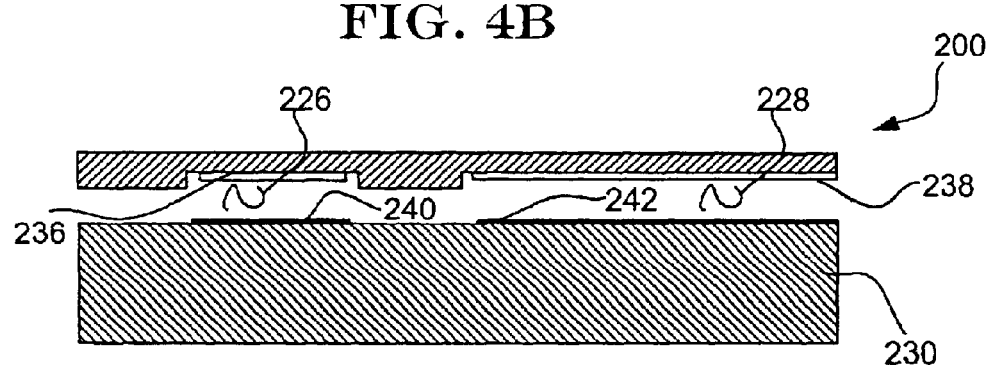
Figure 4C:
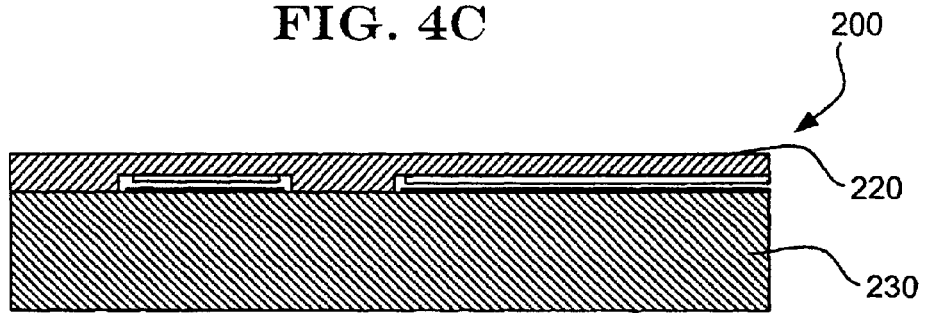

FIGS. 4A–4C are highly diagrammatic, longitudinal, cross-sectional views similar to that shown in FIGS. 2A–2F above, but with the recess or recesses formed in the silicon wafer rather than the glass wafer. Like in FIG. 2A, a silicon wafer 220 having a first surface 222 and a second, substantially co-planar surface 224 is illustrated. A first recess 226 and a second recess 228 are etched into the first surface 222 of the silicon wafer 220, as shown. Preferably, the first recess 226 and the second recess 228 do not extend all the way through the silicon wafer 220. A glass wafer or substrate 230 is also provided, preferably formed from a material such as a Pyrex™ Corning Type No. 7740. The glass wafer 230 has a first surface 232.

As shown in FIG. 4B, a metal layer 236 is provided on the recessed surface of recess 226, and a metal layer 238 is provided on the recessed surface of recess 228. The metal layers 236 and 238 are preferably deposited or otherwise formed thereupon using conventional methods. One suitable metal for the formation of metal layers 236 and 238 is chromium on oxide, although other metals or alloys may be used. FIG. 4B also illustrates the glass wafer 230 after electrodes 240 and 242 have been formed.

FIG. 4C shows silicon wafer 220 and glass wafer 230 after the first surface 222 of the silicon wafer 220 has been bonded to the glass wafer 230. In one embodiment, silicon wafer 220 is bonded using an anodic bonding process. However, other bonding techniques may be used including adhesives, heat bonding, etc. The remaining processing steps may be similar to that shown and described above with respect to FIGS. 2E–2F.

While the above illustrative embodiments use a silicon wafer and a glass wafer, it is contemplated that any suitable material system may be used. For example, rather than using a silicon wafer, it is contemplated that any suitable material system may be used including for example, GaAs, silicon-nitride, etc. Likewise, rather than using a glass wafer, any fairly rigid substrate may be used.

Numerous advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. For example, while the above illustrative embodiments include a silicon wafer bonded to a glass wafer or substrate, other material systems may be used. The invention's scope is, of course, defined in the language in which the appended claims are expressed.

What is claimed is:

1. A method for making a thin silicon structure comprising the steps of:
   providing a glass wafer or substrate;
   providing a silicon wafer having a first substantially planar surface and a second substantially planar surface;
   forming a recess in said glass wafer or silicon wafer first surface;

bonding said silicon wafer to said glass wafer such that at least part of said silicon wafer first surface bonds to said glass wafer and at least part of said silicon wafer first surface overhangs said recess;

after said bonding step, selectively removing a portion of said silicon wafer from said silicon wafer second surface through to said silicon wafer first surface such that a silicon structure is formed overhanging said recess;

providing a metal layer on the first substantially planar surface of the second wafer, such that the metal layer is patterned to approximately coincide with said recess;

stopping the selective removal step at or near said metal layer to form the silicon structure; and removing said metal layer.

2. A method for making a thin silicon structure as in claim 1, further comprising forming at least one electrode on said glass wafer within said recess.

3. A method for making a thin silicon structure as in claim 2, wherein said electrode forming step includes forming a titanium-platinum electrode.

4. A method for making a thin silicon structure as in claim 2, wherein said electrode forming step includes forming a gold electrode.

5. A method for making a thin silicon structure as in claim 1, wherein said bonding step includes anodic bonding.

6. A method for making a thin silicon structure as in claim 1, wherein said selectively removing silicon step includes a DRIE process.

7. A method for making a thin silicon structure comprising the steps of:

providing a glass wafer or substrate;

providing a silicon wafer having a first substantially planar surface and a second substantially planar surface;

forming a recess in said glass wafer surface or said silicon wafer;

providing a patterned metal layer adjacent the silicon wafer, the patterned metal layer coinciding with said recess;

bonding said silicon wafer to said glass wafer such that at least part of said silicon wafer first surface bonds to said glass wafer and overhangs said recess;

selectively etching said silicon wafer above said recess from said second surface through to said first surface and stopping at or near said metal layer to form a silicon structure that at least partially overhangs said recess; and removing said metal layer.

8. A method for making a thin silicon structure as in claim 7, further comprising forming at least one electrode on said glass wafer that is in alignment with at least part of said recess.

9. A method for making a thin silicon structure as in claim 7, wherein said bonding step includes anodic bonding.

10. A method for making a thin silicon structure as in claim 7, wherein said etching step includes a DRIE process.

11. A method for making a thin silicon structure as in claim 8, wherein said electrode forming step includes forming a titanium-platinum electrode.

12. A method for making a thin silicon structure as in claim 8, wherein said electrode forming step includes forming a gold electrode.

13. A method for making a thin silicon structure as in claim 8, wherein said electrode includes an electrode tab or ear extending nearer the unrecessed surface of the glass wafer or silicon wafer.

14. A method for making a thin structure, comprising:

providing a first wafer or substrate;

providing a second wafer having a first substantially planar surface and a second substantially planar surface;

forming a recess in said first wafer substrate;

bonding said second wafer to said first wafer such that at least part of said second wafer first surface bonds to said first wafer so that at least part of said second wafer first surface overhangs said recess;

after said bonding step, selectively removing a portion of said second wafer from said second wafer second surface through to said second wafer first surface such that a thin structure is formed overhanging said recess;

providing a patterned metal layer on the first substantially planar surface of the second wafer, such that the metal layer is patterned to coincide with said recess;

stopping the selective removal step at or near said metal layer to form the thin structure; and removing said metal layer, and wherein at least one portion of said second wafer is not connected to another portion of said second wafer.

15. A method for making a thin structure as in claim 14, wherein the first wafer or substrate is a glass wafer or substrate.

16. A method for making a thin structure as in claim 15, wherein the second wafer is a silicon wafer.

17. A method for making a thin structure as in claim 14, wherein the first wafer or substrate is a silicon wafer.

18. A method for making a thin structure as in claim 17, wherein the second wafer is a glass wafer or substrate.

19. A method for making a thin structure comprising the steps of:

providing a first substrate having a first substantially planar surface and a second substantially planar surface;

providing a second substrate having a first substantially planar surface and a second substantially planar surface;

forming a recess in said first substantially planar surface of said first substrate and/or said first substantially planar surface of said second substrate;

securing said first substrate to said second substrate such that said first substantially planar surface of said first substrate faces said first substantially planar surface of said second substrate;

after said securing step, selectively removing a portion of said first substrate from said second substantially planar surface of said first substrate such that a structure is formed overhanging said recess;

providing a metal layer on the first substantially planar surface of the second wafer, such that the metal layer is patterned to approximately coincide with said recess;

stopping the selective removal step at or near said metal layer to form the structure; and removing said metal layer.

20. A method for making a thin structure comprising the steps of:

providing a first substrate having a first substantially planar surface and a second substantially planar surface;

providing a second substrate having a first substantially planar surface and a second substantially planar surface;

forming a recess in said first substantially planar surface of said first substrate and/or said first substantially planar surface of said second substrate;

securing said first substrate to said second substrate such that said first substantially planar surface of said first substrate faces said first substantially planar surface of said second substrate;

selectively removing a portion of said first substrate from said second substantially planar surface of said first substrate such that a thin structure is formed overhanging said recess, said thin structure being doped at a concentration of between zero and $1 \times 10^{18}$ atm/cm3, providing a metal layer on the first substantially planar surface of the second wafer, such that the metal layer is patterned to approximately coincide with said recess;

stopping the selective removal step at or near said metal layer to form the thin structure; and removing said metal layer; and wherein at least one portion of said first substrate is not connected to another portion of said first substrate.

21. A method for making a thin structure, comprising:

providing a first substrate having a first substantially planar surface and a second substantially planar surface;

providing a second substrate having a first substantially planar surface and a second substantially planar surface;

forming a recess in said first substantially planar surface of said first substrate and/or said first substantially planar surface of said second substrate;

providing a metal layer on the first substantially planar surface of the second substrate adjacent said recess;

securing said second substrate to said first substrate such that said first substantially planar surface of said first substrate faces said first substantially planar surface of said second substrate;

selectively removing a portion of said second substrate from said second substrate second substantially planar surface through to said second substrate first substantially planar surface such that a thin structure is formed overhanging said recess;

stopping the selective removal step at or near said metal layer to form the thin structure; and removing said metal layer.

22. A method for making a thin silicon structure comprising the steps of:

providing a glass wafer or substrate;

providing a silicon wafer having a first substantially planar surface and a second substantially planar surface;

forming a recess in said glass wafer or silicon wafer first surface;

bonding said silicon wafer to said glass wafer such that at least part of said silicon wafer first surface bonds to said glass wafer and at least part of said silicon wafer first surface overhangs said recess;

after said bonding step, selectively removing a portion of said silicon wafer from said silicon wafer second surface through to said silicon wafer first surface such that a silicon structure is formed overhanging said recess;

providing a etch stop layer on the first substantially planar surface of the second wafer, such that the etch stop layer is patterned to approximately coincide with said recess;

stopping the selective removal step at or near said etch stop layer to form the silicon structure; and removing said etch stop layer.

23. A method for making a thin silicon structure as in claim 22, further comprising forming at least one electrode on said glass wafer within said recess.

24. A method for making a thin silicon structure as in claim 23, wherein said electrode forming step includes forming a titanium-platinum electrode.

25. A method for making a thin silicon structure as in claim 23, wherein said electrode forming step includes forming a gold electrode.

26. A method for making a thin silicon structure as in claim 22, wherein said bonding step includes anodic bonding.

27. A method for making a thin silicon structure as in claim 22, wherein said selectively removing silicon step includes a DRIE process.

28. A method for making a thin silicon structure comprising the steps of:

providing a glass wafer or substrate;

providing a silicon wafer having a first substantially planar surface and a second substantially planar surface;

forming a recess in said glass wafer surface or said silicon wafer;

providing a patterned etch stop layer adjacent the silicon wafer, the patterned etch stop layer coinciding with said recess;

bonding said silicon wafer to said glass wafer such that at least part of said silicon wafer first surface bonds to said glass wafer and overhangs said recess;

selectively etching said silicon wafer above said recess from said second surface through to said first surface and stopping at or near said etch stop layer to form a silicon structure that at least partially overhangs said recess; and removing said etch stop layer.

29. A method for making a thin silicon structure as in claim 28, further comprising forming at least one electrode on said glass wafer that is in alignment with at least part of said recess.

30. A method for making a thin silicon structure as in claim 28, wherein said bonding step includes anodic bonding.

31. A method for making a thin silicon structure as in claim 28, wherein said etching step includes a DRIE process.

32. A method for making a thin silicon structure as in claim 29, wherein said electrode forming step includes forming a titanium-platinum electrode.

33. A method for making a thin silicon structure as in claim 29, wherein said electrode forming step includes forming a gold electrode.

34. A method for making a thin silicon structure as in claim 29, wherein said electrode includes an electrode tab or ear extending nearer the unrecessed surface of the glass wafer or silicon wafer.

35. A method for making a thin structure, comprising:

providing a first wafer or substrate;

providing a second wafer having a first substantially planar surface and a second substantially planar surface;

forming a recess in said first wafer substrate;

bonding said second wafer to said first wafer such that at least part of said second wafer first surface bonds to said first wafer so that at least part of said second wafer first surface overhangs said recess;

after said bonding step, selectively removing a portion of said second wafer from said second wafer second surface through to said second wafer first surface such that a thin structure is formed overhanging said recess;

providing a patterned etch stop layer on the first substantially planar surface of the second wafer, such that the etch stop layer is patterned to coincide with said recess;

stopping the selective removal step at or near said etch stop layer to form the thin structure; and removing said etch stop layer; and wherein at least one portion of said second wafer is not connected to another portion of said second wafer.

36. A method for making a thin structure as in claim 35, wherein the first wafer or substrate is a glass wafer or substrate.

37. A method for making a thin structure as in claim 36, wherein the second wafer is a silicon wafer.

38. A method for making a thin structure as in claim 35, wherein the first wafer or substrate is a silicon wafer.

39. A method for making a thin structure as in claim 38, wherein the second wafer is a glass wafer or substrate.

40. A method for making a thin structure comprising the steps of:

providing a first substrate having a first substantially planar surface and a second substantially planar surface;

providing a second substrate having a first substantially planar surface and a second substantially planar surface;

forming a recess in said first substantially planar surface of said first substrate and/or said first substantially planar surface of said second substrate;

securing said first substrate to said second substrate such that said first substantially planar surface of said first substrate faces said first substantially planar surface of said second substrate;

after said securing step, selectively removing a portion of said first substrate from said second substantially planar surface of said first substrate such that a structure is formed overhanging said recess;

providing a etch stop layer on the first substantially planar surface of the second wafer, such that the etch stop layer is patterned to approximately coincide with said recess;

stopping the selective removal step at or near said etch stop layer to form the structure; and removing said etch stop layer.

41. A method for making a thin structure comprising the steps of:

providing a first substrate having a first substantially planar surface and a second substantially planar surface;

providing a second substrate having a first substantially planar surface and a second substantially planar surface;

forming a recess in said first substantially planar surface of said first substrate and/or said first substantially planar surface of said second substrate;

securing said first substrate to said second substrate such that said first substantially planar surface of said first substrate faces said first substantially planar surface of said second substrate;

selectively removing a portion of said first substrate from said second substantially planar surface of said first substrate such that a thin structure is formed overhanging said recess, said thin structure being doped at a concentration of between zero and $1 \times 10^{18}$ atm/cm3, providing a etch stop layer on the first substantially planar surface of the second wafer, such that the etch stop layer is patterned to approximately coincide with said recess;

stopping the selective removal step at or near said etch stop layer to form the thin structure; and removing said etch stop layer; and wherein at least one portion of said first substrate is not connected to another portion of said first substrate.

42. A method for making a thin structure, comprising:

providing a first substrate having a first substantially planar surface and a second substantially planar surface;

providing a second substrate having a first substantially planar surface and a second substantially planar surface;

forming a recess in said first substantially planar surface of said first substrate and/or said first substantially planar surface of said second substrate;

providing a etch stop layer on the first substantially planar surface of the second substrate adjacent said recess;

securing said second substrate to said first substrate such that said first substantially planar surface of said first substrate faces said first substantially planar surface of said second substrate;

selectively removing a portion of said second substrate from said second substrate second substantially planar surface through to said second substrate first substantially planar surface such that a thin structure is formed overhanging said recess;

stopping the selective removal step at or near said etch stop layer to form the thin structure; and removing said etch stop layer.

* * * * *